(12) United States Patent
Park et al.

(10) Patent No.: US 7,114,108 B2
(45) Date of Patent: Sep. 26, 2006

(54) SEMICONDUCTOR TEST SYSTEM AND METHOD FOR EFFECTIVELY TESTING A SEMICONDUCTOR DEVICE HAVING MANY PINS

(75) Inventors: Heon-Deok Park, Incheon (KR); Sang-Bae An, Kyungki-do (KR); Jae-Kuk Jeon, Kyungki-do (KR)

(73) Assignee: Samsung Eelctronics Co., Ltd., Suwon-si (KR)

( * ) Notice: Subject to any disclaimer, the term of this patent is extended or adjusted under 35 U.S.C. 154(b) by 462 days.

(21) Appl. No.: 10/003,180

(22) Filed: Oct. 30, 2001

(65) Prior Publication Data

US 2002/0104049 A1   Aug. 1, 2002

(30) Foreign Application Priority Data

Jan. 26, 2001   (KR) ................... 2001-3749

(51) Int. Cl.
*G11C 29/00* (2006.01)
(52) U.S. Cl. .................................... 714/719
(58) Field of Classification Search ............... 714/718, 714/719
See application file for complete search history.

(56) References Cited

U.S. PATENT DOCUMENTS 4,746,855 A * 5/1988 Wrinn ..................... 324/763
4,775,977 A * 10/1988 Dehara .................... 714/736
5,701,306 A * 12/1997 Arai ....................... 714/724
5,794,175 A * 8/1998 Conner .................... 702/119
6,157,200 A * 12/2000 Okayasu .................. 324/753

FOREIGN PATENT DOCUMENTS

| JP | 9091998 | | 2/1998 |
| JP | 11190761 A | * | 7/1999 |
| KR | P1998-032494 | | 7/1998 |

OTHER PUBLICATIONS

English Abstract of JP 9091998.
English Abstract of P1998-032494.

* cited by examiner

*Primary Examiner*—Guy Lamarre
*Assistant Examiner*—James C. Kerveros
(74) *Attorney, Agent, or Firm*—Marger Johnson & McCollom, P.C.

(57) ABSTRACT

A semiconductor device having many pins is tested using a test system having fewer pins. The test system includes a pin electronics (PE) card and a pattern memory. The PE card preferably includes a plurality of comparator and driver units to drive predetermined input signal pattern to be applied to an input pin of the semiconductor device and to compare data output from an output pin of the semiconductor device with a predetermined output signal pattern. Some or all of the pins of the semiconductor device may be divided into pin groups having K number of pins. The PE card also preferably includes a plurality of control units for electrically connecting each of the comparator and driver units to a selected pin in a selected pin group in response to a control signal.

16 Claims, 5 Drawing Sheets ized Korean Patent
SEMICONDUCTOR TEST SYSTEM AND METHOD FOR EFFECTIVELY TESTING A SEMICONDUCTOR DEVICE HAVING MANY PINS This application relies for priority upon Korean Patent Application No. 2001-3749, filed on Jan. 26, 2001, the contents of which are herein incorporated by reference in their entirety.

BACKGROUND OF THE INVENTION

1. Field of the Invention

The present invention relates to a semiconductor device test system, and more particularly, to a system for effectively testing a semiconductor device having many pins using test equipment having few pins.

2. Description of the Related Art

In general, testing a semiconductor device involves a process in which the DC characteristics, AC characteristics, and functions of a semiconductor device are tested using a test system. Testing the functions of a semiconductor device is generally performed by using the test system to generate predetermined input signal patterns. The input signal patterns are applied to input pins of the device. The test system then receives and compares output signal patterns from the device to predicted output signal patterns. In order to test the functions of the semiconductor device, the test system must be electrically connected to all of the pins of a device under test (DUT). To make this connection, a test head of the test system generally includes a pin electronics (PE) card that is used to electrically connect the test system to each of the pins of the DUT.

Conventionally, the PE card includes a number of channels at least equal to the number of pins in the DUT. That is, in the conventional semiconductor test system, if the number of pins in the DUT is N, the number of channels in the PE card of the test system must be also be N or more. The PE card channels are connected to the pins of the DUT. As a result, when a device has more pins than channels in the semiconductor test system, upgrades to the test system, such as expanding the PE card and increasing pattern memory, are required. When upgrades to the semiconductor test system are no longer feasible, such as when the PE card cannot be expanded any further, the conventional test system can no longer effectively test the characteristics of the semiconductor device.

FIG. 1 illustrates a conventional semiconductor device test system. Referring to FIG. 1, the conventional test system includes a test head 10 having at least one PE card 12. The PE card 12 includes a plurality of comparator and driver units 120_1, . . . , 120_i. Each comparator and driver unit 120_1, . . . , 120_i includes one comparator CP and one driver DR. Pattern data stored in a pattern memory (not shown) is applied to the pins of a DUT 20 by the driver DR, and data output from the pins of the DUT 20 is compared with predicted data. If the output data is the same as the predicted data, the DUT 20 is functioning normally. If the output data is not the same as the predicted data, the DUT 20 is not functioning normally.

The conventional test system's ability to test a semiconductor device having many pins is limited because each comparator and driver unit 120_1, . . . , 120_i corresponds to a single pin of the DUT 20. A semiconductor device having more pins than the test system cannot be tested using a conventional semiconductor test system and method, and upgrading the conventional semiconductor test system for testing a semiconductor device increases test cost.

SUMMARY OF THE INVENTION

To solve the above problems, an object of the present invention is to provide a semiconductor device test system capable of effectively testing a semiconductor device having many pins, while lowering an investment cost of test equipment.

Another object of the present invention is to provide a more efficient method for testing a semiconductor device having many pins.

A semiconductor device test system includes a plurality of comparator and driver units, each having a comparator and a driver. The drivers are configured to drive predetermined input signal patterns to be applied to input pins of the semiconductor device. The comparators are configured to compare data output from output pins of the semiconductor device with predetermined output signal patterns. A plurality of control units are also included for electrically connecting each of the comparator and driver units to a pin in a pin group of the semiconductor device in response to a control signal. Each pin group has K number of pins selected from among the pins of the semiconductor device, where K is an integer greater than 1. A pattern memory stores the input signal patterns and the output signal patterns. Each control unit can be a multiplexer having K number of inputs.

According to another aspect of the invention, a method of testing a semiconductor device is provided. The method includes selecting pins of the semiconductor device. The selected pins are divided into pin groups having K number of pins, where K is an integer greater than 1. A control signal is generated, and comparator and driver units are each electrically connected to one of the pins in a corresponding one of the pin groups based on the control signal. Input signal patterns are input from an input pattern memory and applied to input pins of the semiconductor device. Data output from the output pins of the semiconductor device are compared with the predicted output signal patterns output from an output pattern memory.

According to the semiconductor device test system and method for testing a semiconductor device of these embodiments of the present invention, an increase in investment cost of improved test equipment can be minimized, and a semiconductor device having many pins can be effectively tested using a test system with fewer pins.

BRIEF DESCRIPTION OF THE DRAWINGS

The above objects and advantages of the present invention will become more readily apparent through the following detailed description of preferred embodiments thereof proceeding with reference to the attached drawings, in which.

DETAILED DESCRIPTION OF PREFERRED EMBODIMENTS

Figure 1:
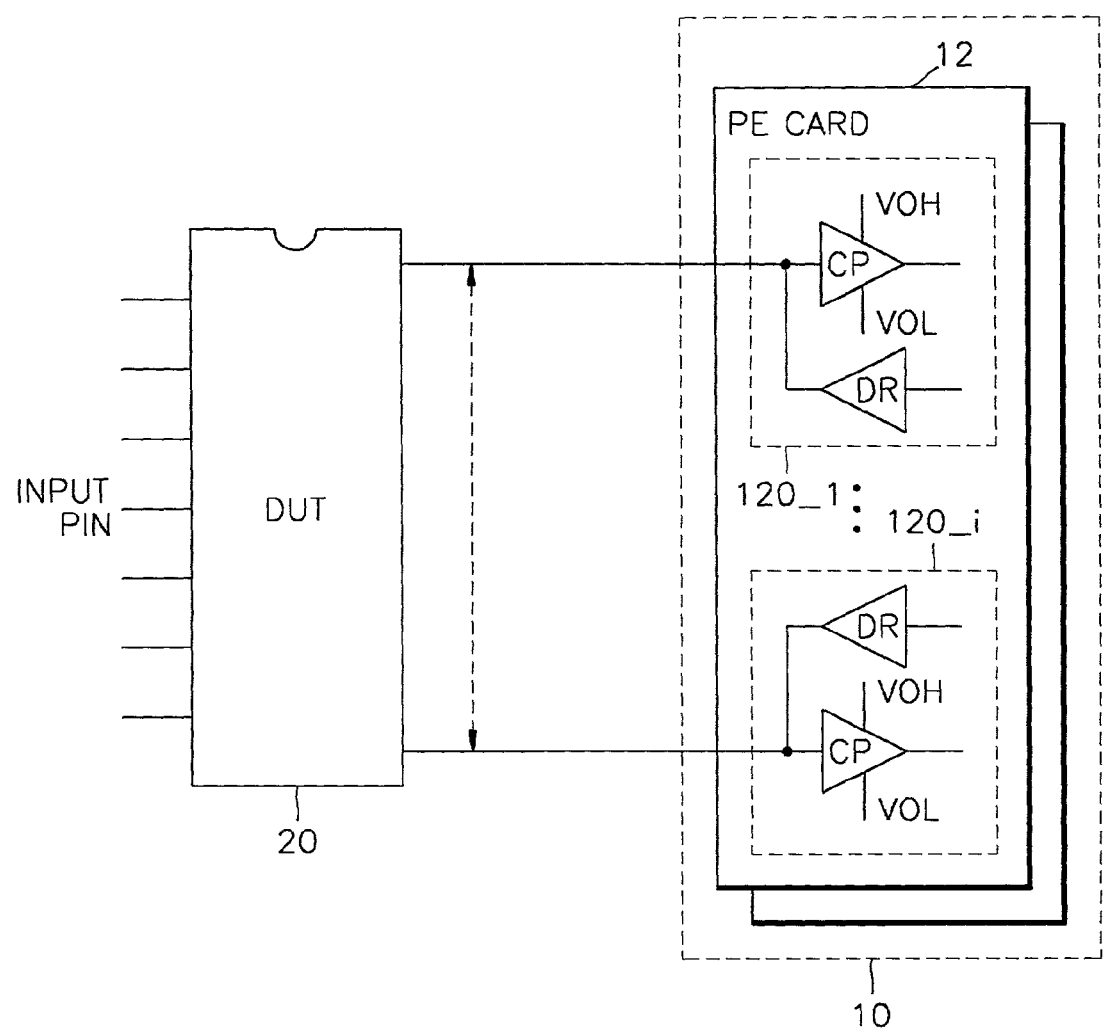
FIG. 1 illustrates a conventional semiconductor device test system.
Figure 2:
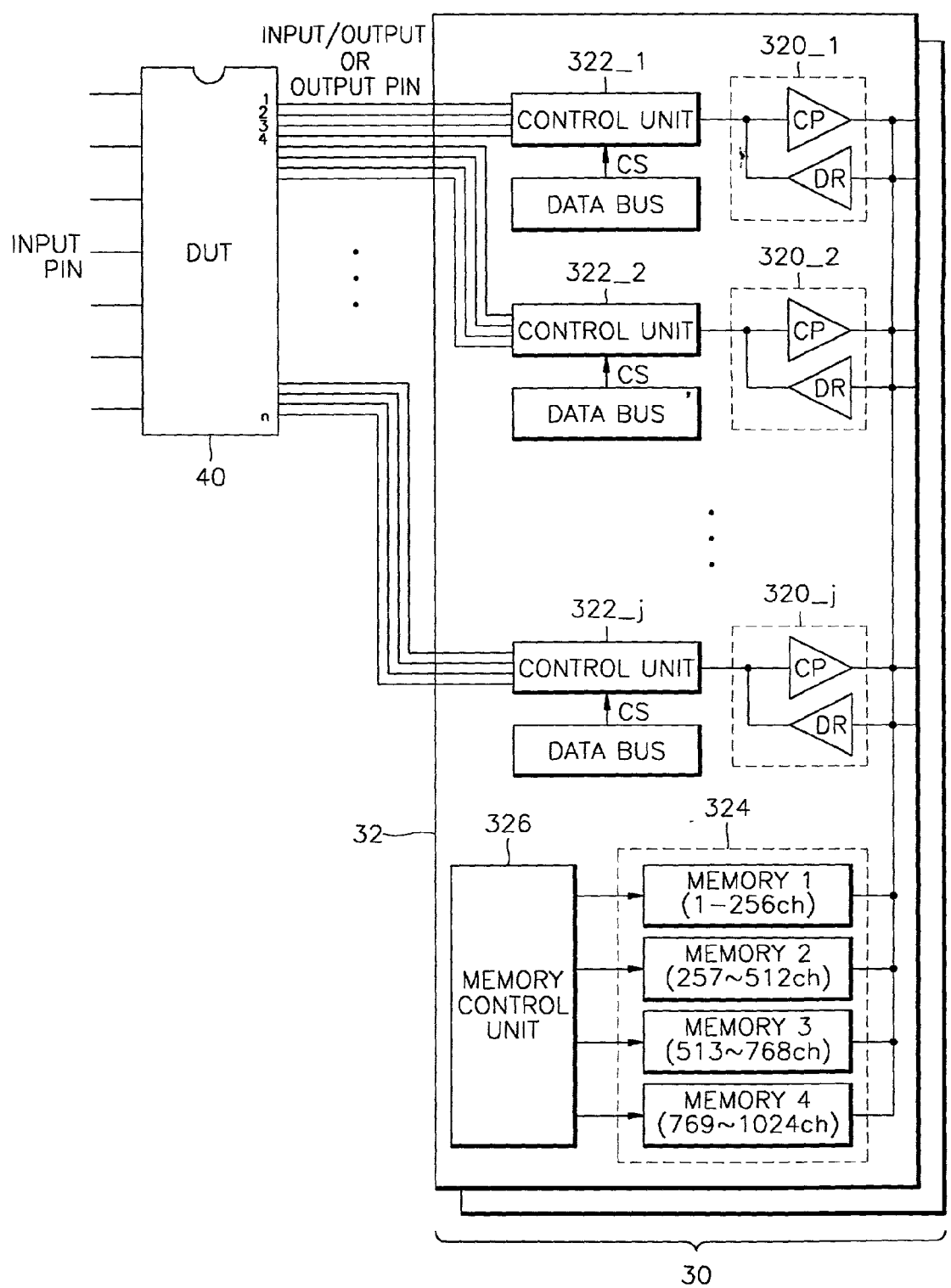
FIG. 2 illustrates a semiconductor device test system according to an embodiment of the present invention.

FIG. 2 illustrates a semiconductor device test system according to an embodiment of the present invention. For convenience of explanation, a device under test (DUT) 40 is also shown in FIG. 2. Referring to FIG. 2, the semiconductor device test system according to this particular embodiment of the present invention includes a test head 30. The test head 30 includes at least one pin electronics (PE) card 32. The PE card 32 includes a plurality of comparator and driver units 320_1, ..., 320_j, a plurality of control units 322_1, ..., 322_j, a pattern memory 324, and a memory control unit 326.

In each comparator and driver unit, a comparator CP is coupled to a driver DR. The driver DR drives input signal patterns stored in the pattern memory 324 to apply as a signal to input pins of the DUT 40. The comparator CP compares data output from output pins of the DUT 40 with predicted data, and then outputs the compared result. The predicted data is the output signal patterns predicted to be output from the output pins. The predicted data can be previously stored in the pattern memory 324. The comparator and driver units 320_1, ..., 320_j correspond to channels of the PE card 32. That is, the number of comparator and driver units 320_1, ..., 320_j is equal to the number of channels of the PE card.

Each of the comparator and driver units 320_1, ..., 320_j is connected to a corresponding control unit 322_1, ..., or 322_j. The number of control units 322_1, ..., 322_j is therefore equal to the number of comparator and driver units 320_1, ..., 320_j. Each control unit 322_1, ..., 322_j connects a corresponding one of the comparator and driver units 320_1, ..., 320_j to two or more pins so that multiple pins share a comparator and driver unit. For this purpose, some or all of the pins of the DUT 40 are divided into pin groups having K number of pins, where K is an integer greater than 1. Each pin group is connected to one of the comparator and driver units 320_1, ..., 320_j by a corresponding one of the control units 322_1, ..., 322_j. The pins in each pin group are selectively connected to the corresponding comparator and driver unit according to a control signal CS.

In the embodiment shown in FIG. 2, a pin group includes four output pins of the DUT 40. Accordingly, input/output pins or output pins are selectively connected to the comparator and driver units 320_1, ..., 320_j by the control units 322_1, ..., 322_j. Four-to-one multiplexers can be used as the control units 322_1, ..., 322_j. The control units 322_1, ..., 322_j are controlled by the control signal CS. The control signal CS can include a number of bits. When the control units 322_1, ..., 322_j are four-to-one multiplexers, the control signal CS preferably includes two bits. The control signal CS is applied to each of the control units 322_1, ..., 322_j via a data bus. As described above, the control units 322_1, ..., 322_j are provided between the pins of the DUT 40 and the comparators and drivers of the PE card 32. Using this configuration, the test system is able to provide the same testing capability as would require four times the number of channels in a PE card of the conventional test system.

The pattern memory 324 stores input signal patterns to be applied to each input pin of the DUT 40 and stores output signal patterns predicted to be output from each output pin. The pattern memory 324 can be divided into a plurality of memory units. In this embodiment, the pattern memory 324 includes four memory units, memory 1 through memory 4.

The output of pattern data from the pattern memory 324 is controlled by the memory control unit 326. In the present embodiment, the pattern memory 324 and the memory control unit 326 are included in the PE card 32. The pattern memory 324 and memory control unit 326 can, however, be implemented separately from each other, or in a card other than the PE card 32.

In the embodiment shown in FIG. 2, an output sharing method is used. In the output sharing method, input pins of the DUT 40 correspond one-to-one to the comparator and driver units of the PE card 32. Output pins and input/output pins, however, correspond four-to-one to the comparator and driver units. Specifically, the output pins are arranged in groups, each having four pins, with each of the control units 322_i, ..., 322_j corresponding to one of the comparator and driver units 320_i, ..., 320_j. The performance of a test using the semiconductor device test system of FIG. 2 will now be described in detail.

A test method using the semiconductor device test system of FIG. 2 proceeds as follows. First, pins are selected from among the pins of the DUT 40 and are divided into pin groups having a predetermined number of pins K, where K is an integer greater than 1. The control signal CS is generated to control each of the control units 322_1, ..., 322_j, so that each of the comparator and driver units 320_1, ..., 320_j is electrically connected to one pin of a corresponding pin group of the DUT 40. The detailed operation of each of the control units 322_1, ..., 322_j based on the control signal CS will be described later.

The input signal patterns are then output from the pattern memory 324 and applied to the input pins of the DUT 40. Data output from the output pins of the DUT 40 are then compared with the predicted output signal patterns. In this embodiment, four output pins of the DUT 40 correspond to one channel of the PE card 32. The detailed operation of a first control unit 322_1, according to different bit combinations of a control signal CS having two bits, is as follows.

When the control signal CS is '00', the first control unit 322_1 connects a first pin 1 to a first comparator and driver unit 320_1. When the first pin 1 is an input pin, the input pattern for the first pin 1, which is output from the pattern memory 324, is input to the first pin 1 by the driver DR of the first comparator and driver unit 320_1. When the first pin 1 is an output pin, data output from the first pin 1 is compared with the predicted output pattern for the first pin 1 in the comparator CP of the first comparator and driver unit 320_1. The output pattern for the first pin 1 is output from the pattern memory 324, controlled by the memory control unit 326.

Likewise, the first control unit 322_1 connects a second pin 2 to the first comparator and driver unit 320_1 when the control signal CS is '01', connects a third pin 3 to the first comparator and driver unit 320_1 when the control signal CS is '10', and connects a fourth pin 4 to the first comparator and driver unit 320_1 when the control signal CS is '11'. Similar to the first control unit 322_1, second through jth control units 322_2, ..., 322_j, each connect one of the four pins in their respective pin group to their corresponding comparator and driver unit 320_2, ..., 320_j as directed by the control signal CS.

Thus, in order to test all of the pins of the DUT 40, the control signal CS must be varied, and the data output from each output pin must be compared with the predicted output pattern. When the output data is the same as the predicted output pattern, the DUT 40 is functioning normally. When the output data is not the same as the predicted output pattern, however, the DUT 40 is not functioning normally.

As described above, four pins of the DUT 40 correspond to one channel of the PE card 32. The PE card 32 according to this embodiment is therefore capable of testing a DUT 40 having four times as many pins as there are channels in the PE card 32. If there are 256 channels on the PE card, for example, since four pins of the DUT correspond to one channel of the PE card, a DUT having a maximum of 1,024 pins can be tested. That is, according to this embodiment, a PE card having 256 channels can perform the same test as a PE card, according to the conventional test system, having 1,024 channels.

Channels resulting from the expanded testing capabilities of the above testing system and method are referred to as expansion channels. A number of expansion channels can correspond to a single PE card channel. Signal patterns for the 1,024 expansion channels of the foregoing embodiment are divided into four groups of 256 channel blocks each, which are stored, respectively, in the first through fourth memory units. In other words, signal patterns for channels 1–256, channels 257–512, channels 513–768, and channels 769–1024 are respectively stored in memory 1 through memory 4 of the pattern memory 324.

The signal patterns for channels 1–256 are output when the control signal CS is '00', the signal patterns for channels 257–512 are output when the control signal CS is '01', the signal patterns for channels 513–768 are output when the control signal CS is '10', and the signal patterns for channels 769–1024 are output when the control signal CS is '11'. Thus, the signal patterns to be output when the control signal CS is '00', '01', '10', and '11' are divided and stored in memory 1 through memory 4, respectively, before the testing operation.

Figure 4:
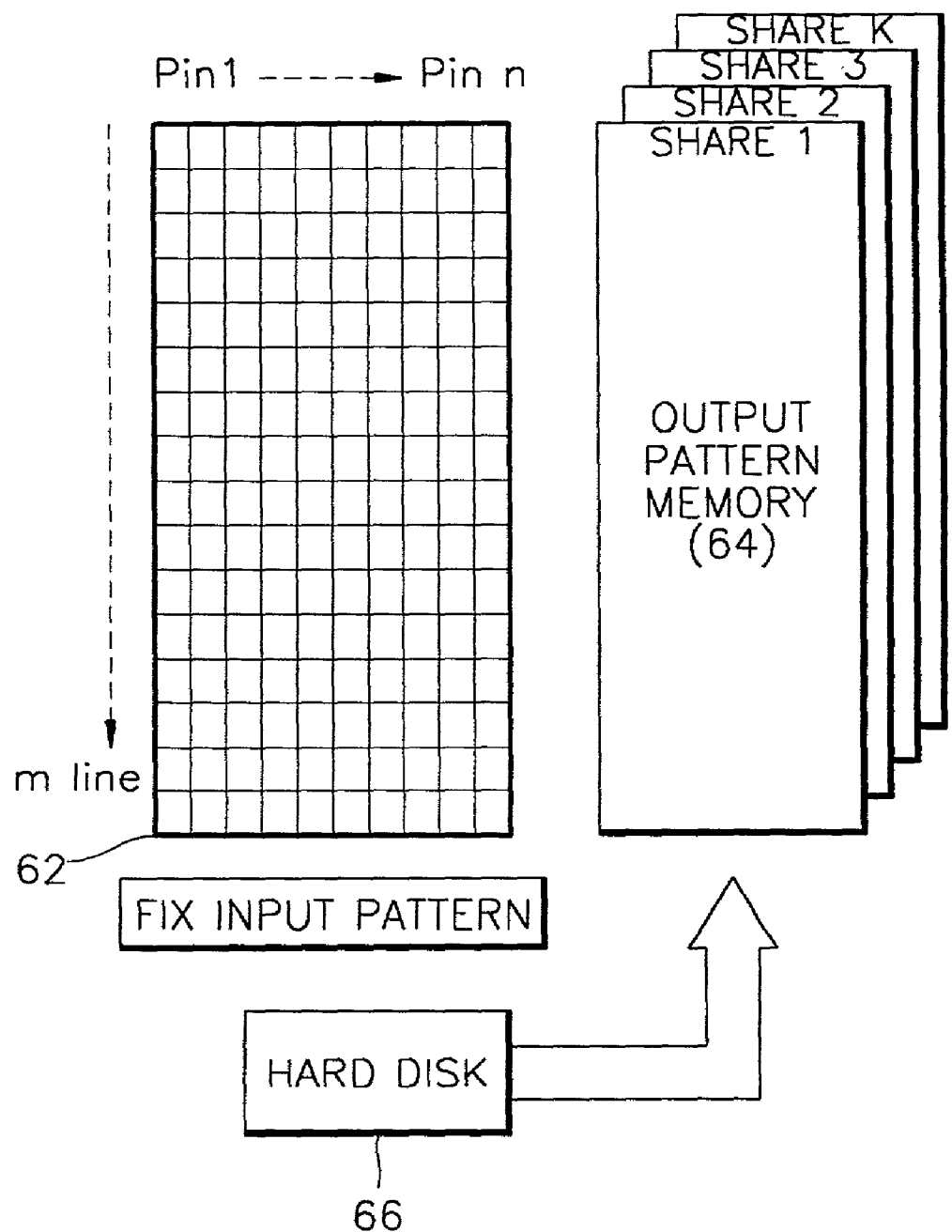
FIG. 4 illustrates a pattern memory of the semiconductor device test system according to an embodiment of a second aspect of the present invention.
Figure 5:
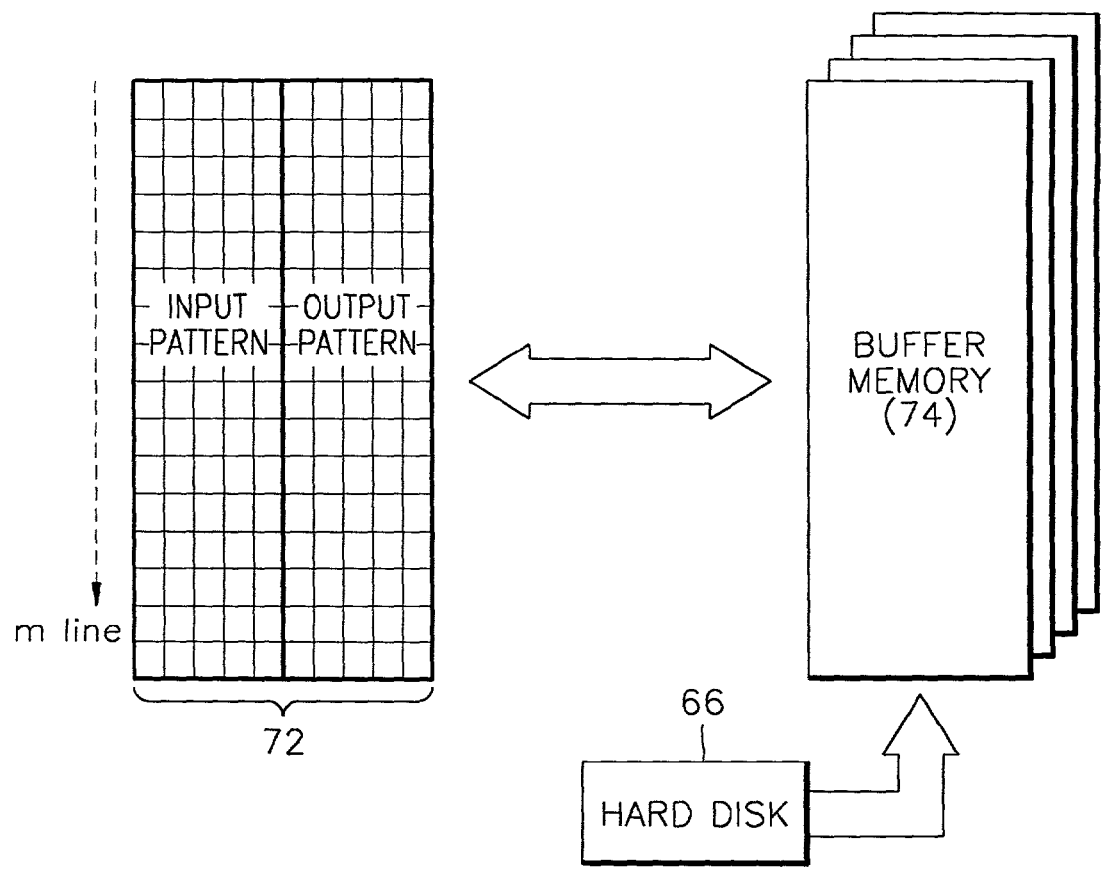
FIG. 5 illustrates the pattern memory of the semiconductor device test system according to another embodiment of the second aspect of the present invention.

Still referring to FIG. 2, the pattern memory 324 has to store the signal patterns for all of the expansion channels. The pattern memory 324 must therefore have a large capacity. As a result, the size of the pattern memory 324 must be greater than that of conventional memories. The pattern memory configurations according to a second aspect of this invention are shown in FIGS. 4 and 5 and help to avoid the problem of increased pattern memory size. Before describing the pattern memories according to this aspect of the present invention, however, the pattern memory of the conventional semiconductor test system will be described with reference to FIG. 3.

Figure 3:
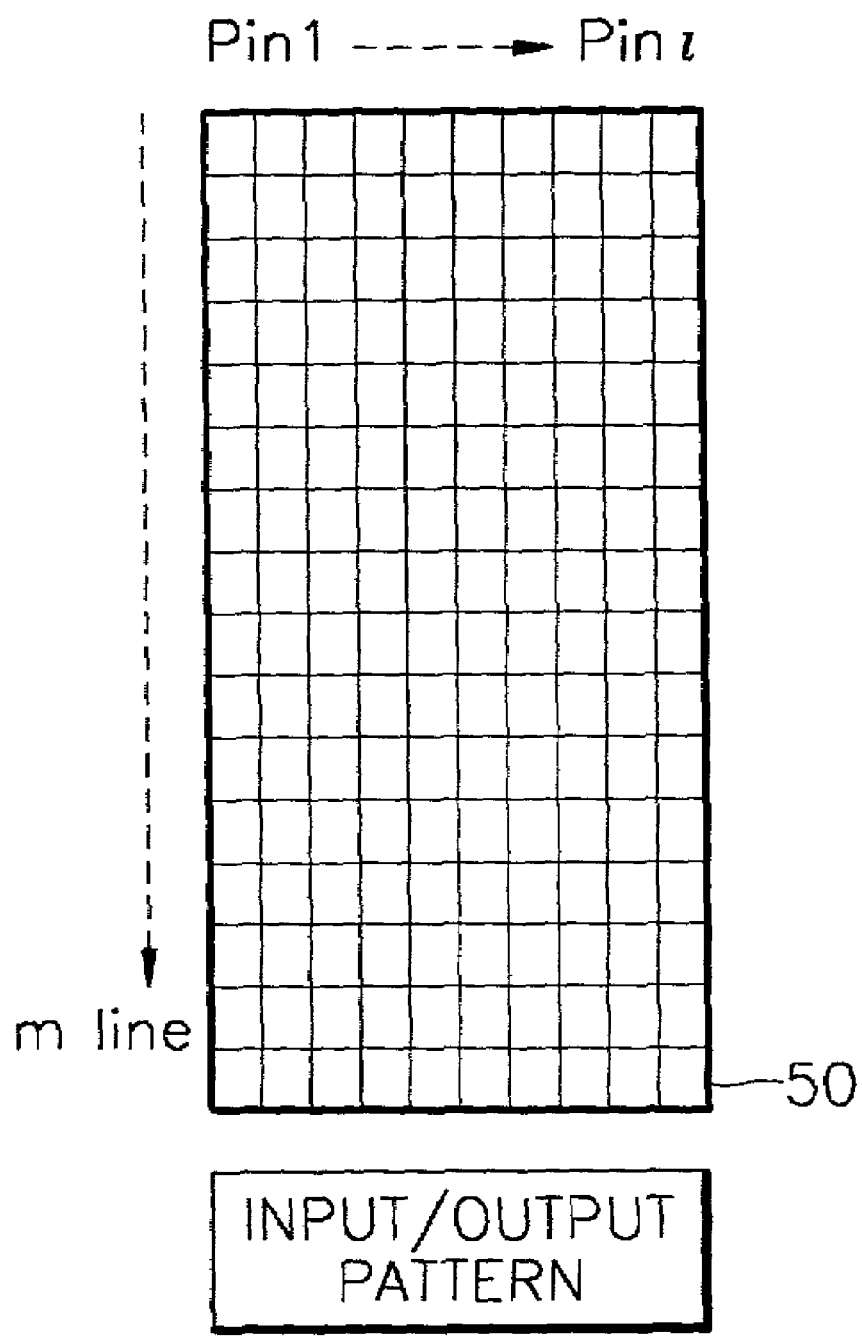
FIG. 3 illustrates a pattern memory of the conventional semiconductor device test system.

FIG. 3 illustrates a pattern memory 50 of the conventional semiconductor device test system, in which channels of the PE card correspond one-to-one to pins of the semiconductor device. The pattern memory 50 stores input/output signal patterns of the first pin through the lth pin Pin1, . . . , PinI. The pattern memory 50 can store up to m lines of input/output signal patterns of the first pin through the Ith pin Pin1, . . . , PinI, and the input/output signal patterns are fixed during the test on the same semiconductor device. If test signal patterns are greater than the m line, new test signal patterns are stored after a test up until the mth line is performed.

FIG. 4 illustrates a pattern memory of the semiconductor test system according to an embodiment of the present invention. Referring to FIG. 4, the pattern memory is divided into an input pattern memory 62 and an output pattern memory 64. The input pattern memory 62 stores signal patterns up to the mth line for input pins Pin1, . . . , Pinn, and the input signal patterns stored in the input pattern memory 62 are fixed during a test using the test signal patterns up to the mth line of the same semiconductor device. The output pattern memory 64 does not store the fixed output signal patterns but does store K number of output signal patterns from share1 to shareK, where K is a multiplexing ratio of each of the control units 322_1, . . . , 322_j.

The control units 322_1, . . . , 322_j selectively connect K number of pins to one comparator and driver unit as directed by the control signal CS. Thus, the control signal CS has at least K number of states. When the control signal CS is placed in a first state to test the semiconductor device, predicted output signal patterns for each pin being selected by the first state are output from a hard disk 66 and stored in the output pattern memory 64. Similarly, when the control signal CS is placed in the second state, predicted output signal patterns for each pin being selected by the second state are output from the hard disk 66 and stored in the output pattern memory 64. The output signal patterns stored in the output pattern memory 64 are therefore varied as directed by the control signal CS, and the size of the output pattern memory 64 is therefore not increased. As described above, in order to properly load K number of output signal patterns to one output pattern memory 64, a circuit or program for controlling the loading can be added to the pattern memory.

FIG. 5 illustrates a pattern memory 72 of the semiconductor test system according to another embodiment of the present invention. Referring to FIG. 5, the pattern memory 72 is divided into an input pattern memory unit and an output pattern memory unit in which input signal patterns and output signal patterns are stored, respectively. The semiconductor device test system according to another embodiment of this second aspect of the present invention further includes a buffer memory 74. Input signal patterns stored in the input pattern memory unit of the pattern memory 72 are fixed. On the other hand, predicted output signal patterns are output from the hard disk 66 and temporarily stored in the buffer memory 74. The signal patterns are then loaded into the output pattern memory unit as occasion demands.

Although the test system and method described previously with reference to FIG. 2 used an output pin sharing method, the semiconductor device test system and method according to the present invention can also be implemented by an input sharing method, an input/output sharing method, or other similar methods. In the input sharing method, the output pins correspond one-to-one to the channels of the PE card 32, and several input pins share one channel of the PE card. In the input/output sharing method, several input pins and output pins share one channel of the PE card. Also, although the pattern memories shown in FIGS. 4 and 5 provide pattern memories for the semiconductor device test system implementing the output sharing method of this invention. The pattern memories according to the foregoing embodiments of the present invention, or other similar pattern memories, can also be applied to the input sharing method or the input/output sharing method.

Referring back to FIG. 2, if the semiconductor device is tested in the package state, the PE card 32 is electrically connected directly to the DUT 40. When the semiconductor device is tested in the wafer state, however, a probe station should be added between the PE card 32 and the DUT 40, such that the probe station is connected to a pad of the wafer via a probe pin. The various aspects of the present invention described above can still be applied during wafer state testing.

The various aspects of the present invention described above can be used to minimize investment costs for test equipment while providing effective testing of semiconductor devices having many pins. Among other things, the semiconductor device test system and method provided by the various aspects of this invention can effectively test a semiconductor device having many pins with test equipment having few pins.

While this invention has been particularly shown and described with reference to various preferred embodiments and aspects thereof, it will be understood by those skilled in the art that changes in form and details may be made thereto without departing from the spirit and scope of the invention as defined by the appended claims.

What is claimed is:

1. A semiconductor device test system comprising:
   a plurality of comparator and driver units, each comparator and driver unit comprising a driver configured to drive an input signal pattern to be applied to two or more input pins of the semiconductor device and a comparator configured to compare data output from two or more output pins of the semiconductor device with a predetermined output signal pattern;
   a plurality of control units, each control unit configured to electrically connect a corresponding comparator and driver unit to a pin of the semiconductor device in response to a control signal, wherein pins of the semiconductor device are divided into pin groups, each pin group having K number of pins, where K is an integer greater than 1; and
   a pattern memory for storing the input signal patterns and the output signal patterns, the pattern memory including:
      an input pattern memory for storing input signal patterns; and
      an output pattern memory for storing output signal patterns, wherein the output pattern memory stores K output signal patterns retrievable from an external device.

2. The semiconductor device test system according to claim 1, wherein each control unit is a multiplexer having K number of inputs.

3. The semiconductor device test system according to claim 1, wherein each control unit is configured to receive the control signal via a data bus.

4. The semiconductor device test system according to claim 1, wherein the external device is a hard disk drive.

5. The semiconductor device test system according to claim 1, wherein the pins of each pin group are input pins, and wherein the input pattern memory stores input signal patterns from an external device according to a state of the control signal.

6. The semiconductor device test system according to claim 1, wherein the pins of each pin group include input pins and/or output pins, and wherein the input pattern memory stores the input signal patterns from an external device according to a state of the control signal.

7. The semiconductor device test system according to claim 1, wherein the pins of each pin group are output pins, and wherein the predicted output signal patterns are stored in a buffer memory and loaded into the output pattern memory as occasion demands.

8. A method of testing a semiconductor device, the method comprising:
   selecting pins from among a plurality of pins of the semiconductor device;
   dividing the selected pins into a plurality of pin groups, each pin group comprising a desired plural number of pins;
   generating a control signal;
   electrically connecting a comparator and driver unit to a single pin in a corresponding one of the pin groups of the semiconductor device according to the control signal;
   applying input signal patterns from an input pattern memory to the single pin; and
   comparing data output from output pins of the semiconductor device via the single pin with output signal patterns output from an output pattern memory that stores the desired plural number of output signal patterns retrievable from an external device.

9. The method according to claim 8, wherein the selected pins are input pins of the semiconductor device, and wherein the input signal patterns are stored in the input pattern memory according to a state of the control signal.

10. The method according to claim 8, wherein the selected pins are output pins of the semiconductor device, and wherein the output signal patterns are stored in the output pattern memory according to a state of the control signal.

11. The method according to claim 8, wherein all of the pins of the semiconductor device are selected and divided into pin groups, wherein the input signal patterns are output from the external storage device and stored in the input pattern memory according to a state of the control signal, and wherein the output signal patterns are output from the external storage device and stored in the output pattern memory according to the state of the control signal.

12. A method of testing a semiconductor device having many pins using a test system having fewer pins, said method comprising:
   selectively connecting a pin of the test system to a pin of the semiconductor device based on a control signal;
   applying an input signal pattern to the pin of the semiconductor device;
   comparing data output from the semiconductor device with a predetermined output signal pattern that is stored in a hard disk; and
   storing the predetermined output signal pattern responsive to the control signal, wherein the hard disk outputs the predetermined output signal pattern to an output pattern memory that stores the predetermined output signal pattern, and wherein the output pattern memory is connected between the hard disk and the semiconductor device.

13. The method according to claim 12, wherein the pin of the test system comprises a comparator and driver unit, said comparator and driver unit comprising a comparator configured to compare an output pattern from an output pin of the semiconductor device with a predetermined output pattern and a driver configured to drive an input pattern for an input pin of the semiconductor device, and wherein the comparator and driver unit is selectively connected to the pin of the semiconductor device based on the control signal.

14. The method according to claim 12, wherein pins of the semiconductor device are divided into a plurality of pin groups, each pin group comprising a plurality of pins.

15. The method according to claim 14, wherein the pin of the test system is selectively connected to one of the pins in a corresponding pin group via a control unit based on the control signal.

16. The method according to claim 14, wherein the pin of the test system comprises a comparator and driver unit and a control unit and wherein the control unit selectively connects one of the pins from a corresponding pin group to the comparator and driver unit based on the control signal.

* * * * *